US012580557B2

(12) United States Patent
Chen et al.

(10) Patent No.: US 12,580,557 B2
(45) Date of Patent: Mar. 17, 2026

(54) METHOD, APPARATUS FOR OPERATING A CONDUCTION ASSEMBLY, START DEVICE, AND COMPUTER-READABLE MEDIUM

(71) Applicant: Schneider Electric Industries SAS, Rueil Malmaison (FR)

(72) Inventors: Xiaohang Chen, Shanghai (CN); Yangfeng Song, Shanghai (CN); Wanlong Bai, Shanghai (CN); Qing Ling, Shanghai (CN); Zuoren Wu, Shanghai (CN); Jiamin Chen, Shanghai (CN)

(73) Assignee: Schneider Electric Industries SAS, Rueil Malmaison (FR)

( * ) Notice: Subject to any disclaimer, the term of this patent is extended or adjusted under 35 U.S.C. 154(b) by 13 days.

(21) Appl. No.: 18/574,743

(22) PCT Filed: Apr. 19, 2023

(86) PCT No.: PCT/CN2023/089241
§ 371 (c)(1),
(2) Date: Dec. 28, 2023

(87) PCT Pub. No.: WO2023/202624
PCT Pub. Date: Oct. 26, 2023

(65) Prior Publication Data
US 2024/0322811 A1     Sep. 26, 2024

(30) Foreign Application Priority Data
Apr. 20, 2022     (CN) ......................... 202210420784.8

(51) Int. Cl.
H03K 17/06        (2006.01)
H03K 17/0416      (2006.01)
H03K 17/13        (2006.01)

(52) U.S. Cl.
CPC ..... *H03K 17/063* (2013.01); *H03K 17/04163* (2013.01); *H03K 17/136* (2013.01)

(58) Field of Classification Search
CPC ........... H03K 17/063; H03K 17/04163; H03K 17/136
See application file for complete search history.

(56) References Cited

U.S. PATENT DOCUMENTS 6,034,790 A * 3/2000 Kamei ................. G03G 15/043
358/475
2016/0149505 A1* 5/2016 Dickey ................. H02M 5/293
323/235

FOREIGN PATENT DOCUMENTS

CN          1732616 A        2/2006
CN       104285351 A        1/2015
(Continued)

OTHER PUBLICATIONS

Patent Cooperation Treaty "International Search Report" mailed Jun. 23, 2023, China National Intellectual Property Administration as ISA/CN, 5 pages.

*Primary Examiner* — Daniel C Puentes
(74) *Attorney, Agent, or Firm* — FIG. 1 Patents

(57)        ABSTRACT

Embodiments of the present disclosure relate to a method, apparatus for operating a conduction assembly, a start device, and a computer-readable medium. The conduction assembly is coupled between an AC power supply and an inductive load, and comprises a first switch device and a second switch device which are in anti-series connection, the first switch device comprises a first body diode in anti-parallel connection with the first switch device, and the second switch device comprises a second body diode in anti-parallel connection with the second switch device. The method comprises: conducting the conduction assembly at a first conduction angle in a first cycle; conducting the con-
(Continued)

duction assembly in a second cycle at a second conduction angle that is greater than the first conduction angle, wherein in the first cycle and second cycle, a turn-off timing of the first switch device or the second switch device in anti-parallel connection with the first body diode or second body diode having a conduction direction the same as a current direction is determined based on the current flowing through the conduction assembly. The method proposed here may reduce the power loss of the soft start circuit.

10 Claims, 5 Drawing Sheets

(56)                  References Cited

FOREIGN PATENT DOCUMENTS

| CN | 213185474 | U |   | 5/2021 |
|----|-----------|---|---|--------|
| JP | 2009081969 | A | * | 4/2009 |
| JP | 2019004656 | A |   | 1/2019 |

* cited by examiner

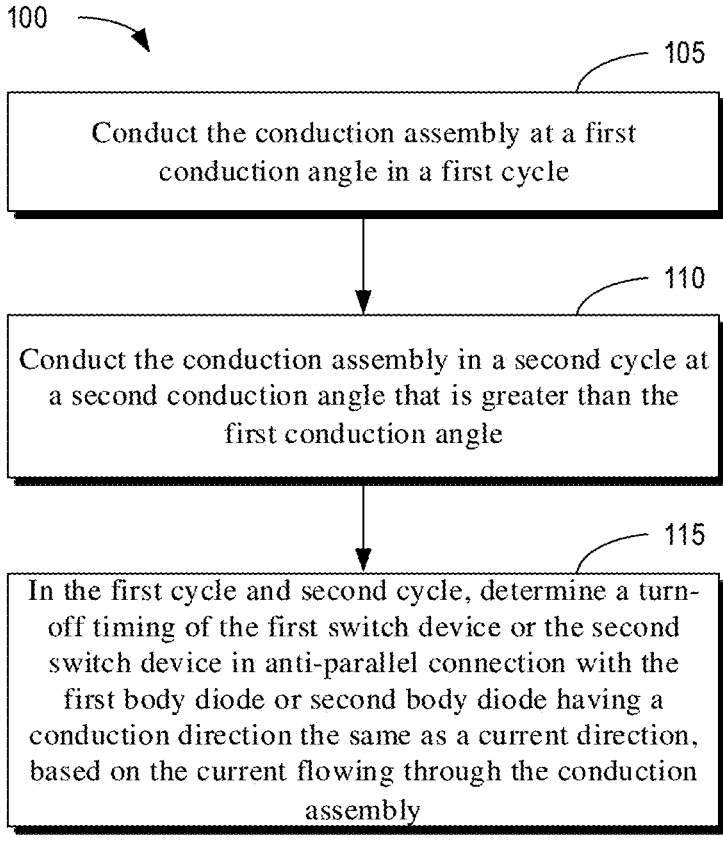

100

105

Conduct the conduction assembly at a first conduction angle in a first cycle

110

Conduct the conduction assembly in a second cycle at a second conduction angle that is greater than the first conduction angle

115

In the first cycle and second cycle, determine a turn-off timing of the first switch device or the second switch device in anti-parallel connection with the first body diode or second body diode having a conduction direction the same as a current direction, based on the current flowing through the conduction assembly

FIG. 7

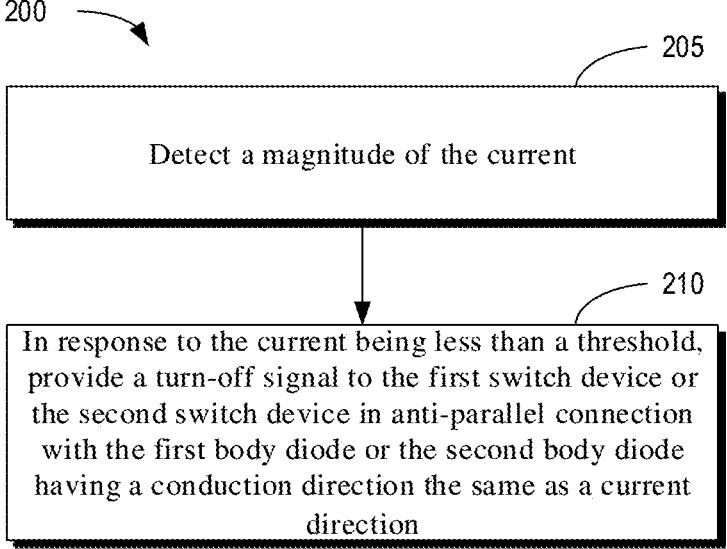

200

205

Detect a magnitude of the current

210

In response to the current being less than a threshold, provide a turn-off signal to the first switch device or the second switch device in anti-parallel connection with the first body diode or the second body diode having a conduction direction the same as a current direction

FIG. 8

METHOD, APPARATUS FOR OPERATING A CONDUCTION ASSEMBLY, START DEVICE, AND COMPUTER-READABLE MEDIUM

FIELD

Embodiments of the present invention relate generally to a method, apparatus for operating a conduction assembly, a start device, and a computer-readable medium, and more specifically, to a method, apparatus for operating a soft start circuit, a start device, and a computer-readable medium.

BACKGROUND

Conventional soft start manners mostly employ a manner of gradually increasing a conduction angle of a conduction device in multiple cycles. However, the conventional soft start manners cause a large power loss during the start-up process and meanwhile reduces the service life of components.

SUMMARY

Embodiments of the present disclosure provide a method, apparatus for operating a conduction assembly, a start device, and a computer-readable medium, which can reduce the loss caused during the start and thereby at least partly solve the above and other potential problems existing in the prior art.

A first aspect of the present disclosure relates to a method of operating a conduction assembly. The conduction assembly is coupled between an AC power supply and an inductive load, and comprises a first switch device and a second switch device which are in anti-series connection, the first switch device comprises a first body diode in anti-parallel connection with the first switch device, and the second switch device comprises a second body diode in anti-parallel connection with the second switch device. The method comprises: conducting the conduction assembly at a first conduction angle in a first cycle; conducting the conduction assembly in a second cycle at a second conduction angle that is greater than the first conduction angle, wherein in the first cycle and second cycle, a turn-off timing of the first switch device or the second switch device in anti-parallel connection with the first body diode or second body diode having a conduction direction the same as a current direction is determined based on the current flowing through the conduction assembly.

Through the above embodiments, the first switch device and second switch device are at least partially in an ON state at the same time during the start, thereby reducing the power loss as compared with the conventional soft start.

According to one embodiment, determining the turn-off timing based on the current comprises: detecting a magnitude of the current; in response to the current being less than a threshold, providing a turn-off signal to the first switch device or the second switch device in anti-parallel connection with the first body diode or the second body diode having a conduction direction the same as a current direction. Through the above embodiment, the magnitude of the current flowing through the body diode can be reduced and thereby the power loss of the body diode can be reduced.

According to one embodiment, the method further comprises conducting the conduction assembly in at least one third cycle at at least one third conduction angle, wherein the conduction angle used in a subsequent cycle in the first, second and third cycles is greater than that used in a previous cycle. Through the above embodiment, the soft start can be achieved.

According to one embodiment, the method further comprises providing a turn-off signal to the first switch device or the second switch device in response to the current being equal to zero. Through the above embodiment, natural zero crossing turn-off of the conduction assembly can be achieved, and the service life of the conduction assembly can be increased.

According to one embodiment, the method further comprises determining an increase in the conduction angle per cycle based on a voltage boost slope of the inductive load and a preset boost curve. Through the embodiment, the soft start can be achieved at a predetermined rate.

According to one embodiment, the threshold is determined based on an accuracy of the detection of the current. Through the above embodiment, the power loss of the conduction assembly may be reduced as much as possible.

According to one embodiment, the turn-off timing comprises a voltage zero crossing point of the conduction assembly. Through the above embodiment, the soft start may be achieved by only detecting the voltage across the conduction assembly.

A second aspect of the present disclosure relates to an apparatus of operating a conduction assembly. The conduction assembly is coupled between an AC power supply and an inductive load, and comprises a first switch device and a second switch device which are in anti-series connection, the first switch device comprises a first body diode in anti-parallel connection with the first switch device, and the second switch device comprises a second body diode in anti-parallel connection with the second switch device. The apparatus comprises: a current sampling device for sampling the current in the conduction assembly; and a controller communicatively connected to the current sampling device and configured to perform the method according to any of the preceding embodiments.

A third aspect of the present disclosure relates to a start device comprising the apparatus described in the above embodiment.

A fourth aspect of the present disclosure relates to a computer-readable medium having stored thereon computer-executable instructions that, when are run on a processor, perform the method according to the preceding embodiments.

BRIEF DESCRIPTION OF THE DRAWINGS

The above and other objects, features and advantages of the embodiments of the present disclosure will become more apparent from the following detailed description with reference to the accompanying drawings. In the figures, multiple embodiments of the present disclosure will be described in an exemplary and non-limiting manner.

FIG. 7 illustrates a flow chart of a method of operating a conduction assembly according to an embodiment of the present disclosure;

3

4

Figure 9:
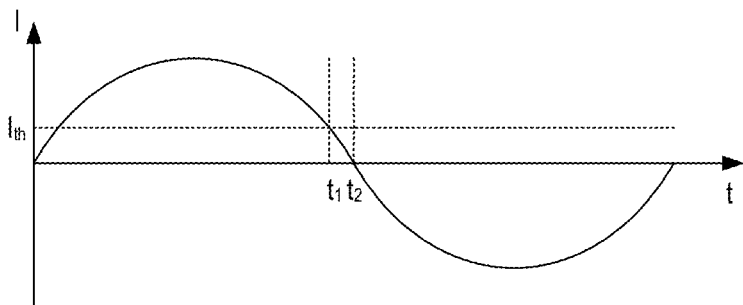
Figure 10:
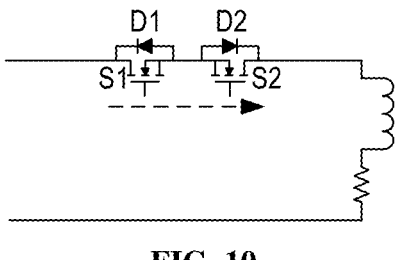
Figure 11:
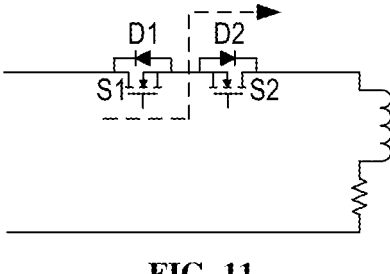
Figure 12:
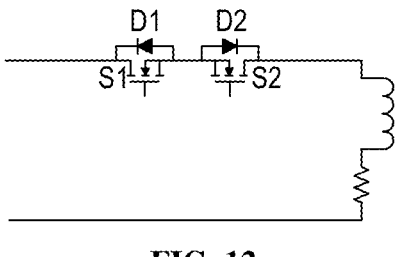
Figure 13:
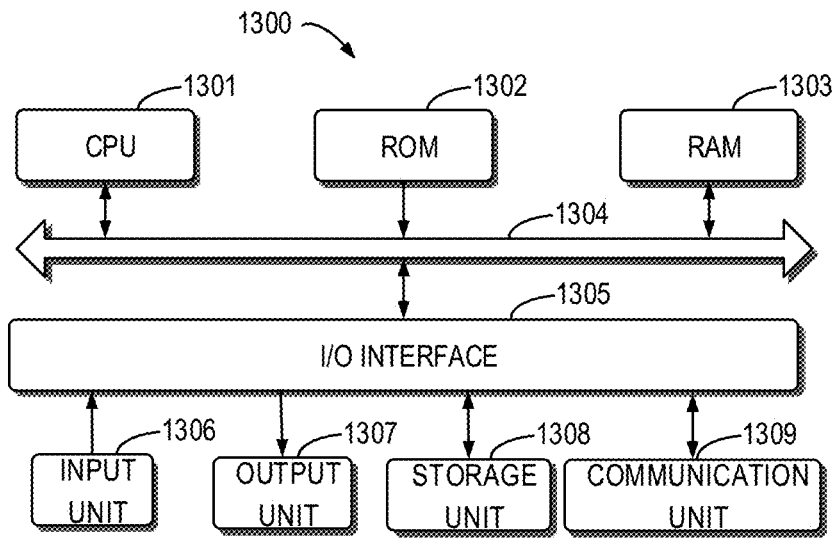

FIG. 8 illustrates a flow chart of determining a turn-off timing in a method of operating a conduction assembly according to an embodiment of the present disclosure;

FIG. 9 illustrates a schematic diagram of a current waveform upon operating the conduction assembly by the method according to an embodiment of the present disclosure;

FIG. 10-FIG. 12 illustrate schematic diagrams of operating the conduction assembly by the method according to an embodiment of the present disclosure; and FIG. 13 illustrates a block diagram of an example device that may be used to implement embodiments of the present disclosure.

DETAILED DESCRIPTION OF EMBODIMENTS

The principles of the present disclosure will now be described with reference to various exemplary embodiments shown in the drawings. It should be appreciated that the description of these embodiments is merely intended to enable those skilled in the art to better understand and to further implement the present disclosure, and is not intended to limit the scope of the present disclosure in any way. It should be appreciated that where possible, similar or identical reference numbers may be used throughout the drawings and may indicate similar or identical functions. Those skilled in the art will readily recognize from the following description that alternative embodiments of the structures and methods illustrated herein may be employed without departing from the principles of the invention described herein.

Figure 1:
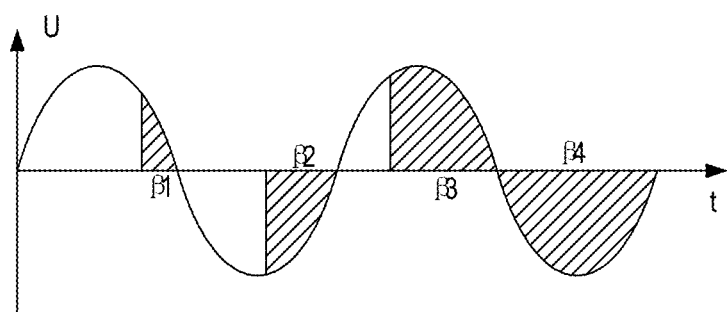
FIG. 1 illustrates a schematic diagram of a conduction waveform of a switch device in a soft start circuit in the prior art.

The structure of a soft start circuit and disadvantages of a soft start method in the prior art will be described in detail below with reference to FIGS. 1-6. Reference is first made to FIG. 1, which shows a schematic diagram of a conduction waveform of a switch device in a soft start circuit in the prior art.

As shown in FIG. 1, with regard to an inductive load, in the prior art, a soft start is usually achieved by gradually increasing a conduction angle of a conduction device in each cycle of the soft start. The conduction angle refers to a conduction time of the conduction device in each cycle of the soft start. In this way, a current variation in the inductive load is small, so that the voltage applied to both ends of the conduction device gradually increases from low to high without damaging the conduction device.

Figure 2:
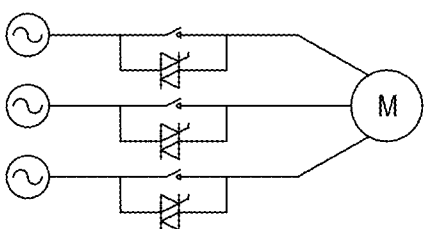
FIG. 2 illustrates a schematic diagram of a soft start circuit based on a thyristor and a relay in the prior art.

FIG. 2 illustrates a schematic diagram of a soft start circuit based on a thyristor and a relay in the prior art. As shown in FIG. 2, each branch of such a soft start circuit of an inductive load (e.g., a three-phase motor) comprises a thyristor and a relay connected in parallel, a conduction angle of the thyristor gradually increases every half alternating current cycle, and finally the relay is closed when the conduction angle reaches a maximum, thereby completing the soft start. Due to the characteristics of the thyristor itself, the thyristor causes a large loss upon conduction so that the loss of this soft start circuit is large as a whole.

Figure 3:
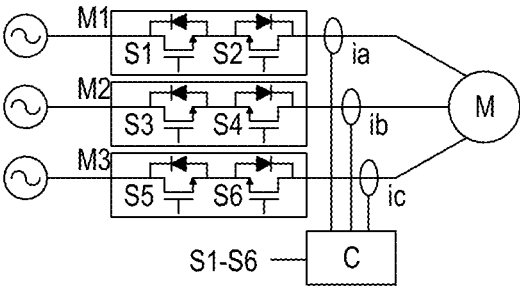
FIG. 3 illustrates a schematic diagram of a soft start circuit based on reverse series transistors in the prior art.

FIG. 3 illustrates a schematic diagram of a soft start circuit based on reverse series transistors in the prior art. As shown in FIG. 3, each branch of such a soft start circuit of an inductive load (e.g., a three-phase motor) comprises conduction assemblies M1-M3, each of the conduction assemblies comprising transistors in anti-series connection. Since the loss of the transistors when conducted is less than that of the thyristors, the overall loss of the soft start circuit shown in FIG. 3 is less than that of the soft start circuit shown in FIG. 2. The operation principles of the soft start circuit shown in FIG. 3 will now be described with reference to FIGS. 4-6, by taking phase A and phase B as examples.

Figure 4:
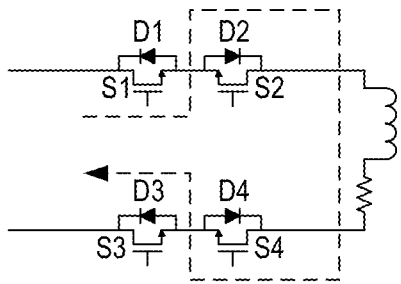
FIG. 4-FIG. 6 illustrate schematic diagrams of operation processes of the soft start circuit shown in FIG. 3.
Figure 5:
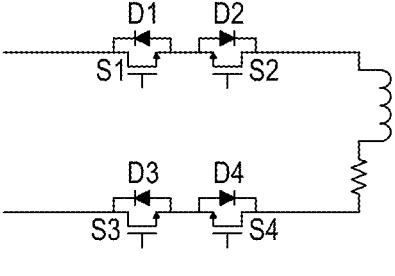
Figure 6:
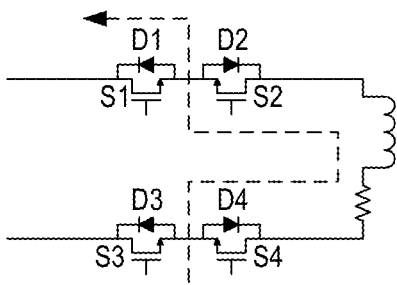

FIG. 4-FIG. 6 illustrate schematic diagrams of an operation process of the soft start circuit shown in FIG. 2. As shown in FIG. 4, an A-phase branch of the soft start circuit envelops a conduction assembly M1, which comprises transistors S1 and S2 in anti-series connection, and a B-phase branch comprises a conduction assembly M2, which comprises transistors S3 and S4 in anti-series connection. Each transistor comprises body diodes in anti-parallel connection. In a first cycle of soft start, assuming that the A-phase voltage is higher than the B-phase voltage, a soft start controller controls S1 and S4 to turn on and S2 and S3 to turn off. At this time, the current passes from an A-phase power supply through the body diodes of S1, S2, and the body diodes of S4, S3 to a B-phase power supply.

As shown in FIG. 5, after the conduction angles of M1 and M2 in the first cycles are reached, the soft start controller turns off S1-S4. Since a conduction voltage drop across the body diode is about 0.7V, the loss of the soft start circuit in the first cycle is about 2*0.7V*the current flowing through the body diodes at the conduction angles in the first cycle.

As shown in FIG. 6, in the second cycle of the soft start, when the A-phase voltage is lower than the B-phase voltage, the soft start controller controls S2 and S3 to turn on and S1 and S4 to turn off. At this time, the current passes from the B-phase power supply through the body diodes of S3, S4 and the body diodes of S2, S1 to the A-phase power supply.

When the conduction angles of M1 and M2 in the second cycle are reached, the soft start controller turns off S1-S4. Since a conduction voltage drop across the body diode is about 0.7V, the loss of the soft start circuit in the second cycle is about 2*0.7V*the current flowing through the body diodes at the conduction angles in the second cycle.

The above steps are repeated until the conduction angles of M1 and M2 reach a maximum and the soft start ends.

The above control manner does not require the detection of the voltage across M1 and M2 and the current flowing therein, and only requires the control the ON and OFF of M1 and M2 according to the conduction angles, so that the control manner is simple.

However, due to the voltage drop across the body diode, the above control manner will result in a large loss of M1 and M2 during the soft start, which affects the lifetime of the device.

A backup power supply delay control circuit according to an exemplary embodiment of the present disclosure will be described in detail below with reference to FIGS. 7-12. Reference is first made to FIG. 7, which illustrates a flow chart of a method of operating a conduction assembly according to an embodiment of the present disclosure. The conduction assembly is coupled between an AC power supply and an inductive load, and comprises a first switch device and a second switch device which are in anti-series connection, the first switch device comprises a first body diode in anti-parallel connection with the first switch device, and the second switch device comprises a second body diode in anti-parallel connection with the second switch device.

As shown in FIG. 7, the method of operating a conduction assembly comprises: at 105, conducting the conduction assembly at a first conduction angle in a first cycle; at 110, conducting the conduction assembly in a second cycle at a second conduction angle that is greater than the first conduction angle; at 115, in the first cycle and second cycle, determining a turn-off timing of a first switch device or a second switch device in anti-parallel connection with the first body diode or second body diode having a conduction direction the same as a current direction, based on the current flowing through the conduction assembly.

In the embodiments described above, the switch devices in the conduction assembly are all in an ON state in partial time period during the soft start. Since the conduction voltage drop of the switch device (e.g., MOSFET) is much smaller than that across the body diode, the method according to the present embodiment may reduce the loss of the soft start circuit and prolong the lifetime of the conduction assembly as compared with the control manner of the soft start circuit shown in FIG. 3.

In some embodiments, the method further comprises conducting the conduction assembly in at least one third cycle at at least one third conduction angle, wherein the conduction angle used in a subsequent cycle in the first, second and third cycles is greater than that used in a previous cycle. In other embodiments, other multiple cycles may be included, with each subsequent cycle having a conduction angle greater than that of a previous cycle, which may be determined according to specific design requirements and cost.

In some embodiments, the method further comprises providing a turn-off signal to the first switch device or the second switch device in response to the current being equal to zero. In this way, a zero current turn-off of the conduction assembly can be achieved. In other embodiments, the conduction assembly may also be turned off in other ways, which may be determined according to specific actual requirements and cost.

In some embodiments, the method further comprises determining an increase in the conduction angle per cycle based on a voltage boost slope of the inductive load and a preset boost curve. In other embodiments, the conduction angle may also be adjusted in other ways, which may be determined based on specific design requirements and cost.

FIG. 8 illustrates a flow chart of determining a turn-off timing in a method of operating a conduction assembly according to an embodiment of the present disclosure. As shown in FIG. 8, determining the turn-off timing based on the current comprises: at 205, detecting a magnitude of the current; at 210, in response to the current being less than a threshold, providing a turn-off signal to the first switch device or the second switch device in anti-parallel connection with the first body diode or the second body diode having a conduction direction the same as a current direction.

FIG. 9 illustrates a schematic diagram of a current waveform upon operating the conduction assembly by the method according to an embodiment of the present disclosure As shown in FIG. 9, the controller sends a turn-off signal when it is detected at time t1 that the current in the conduction assembly has been less than a threshold Ith.

In order to reduce loss as much as possible, it is desirable that the closer Ith is to zero, the better. In certain embodiments, Ith=0. That is, when the current in the conduction assembly reaches zero at time t2, the controller sends a turn-off signal.

However, in an actual current detection process, the detection accuracy of a current sensor affects the selection of the threshold Ith. For example, if the detection accuracy of the current sensor is 0.1 A, the output of the current sensor may be the same when the current flowing through the conduction assembly is 0.1 A and 0 A. Thus, in some embodiments, the threshold is determined based on the accuracy of the detection of the current. In other embodiments, the threshold may also be selected in other ways, which may be determined based on specific design requirements and cost.

In some embodiments, the turn-off timing comprises a voltage zero crossing point of the conduction assembly. This is because, in an inductive load, the voltage leads the current by an angle. When the angle is small, the current approaches zero when the voltage reaches zero. Turning off the conduction assembly at this time may also achieve a similar effect as the above-described solution of turning off the conduction assembly by detecting that the current is less than the threshold, and may save the current sensor.

A detailed process of controlling the conduction assembly by the method of the present embodiment is described below with reference to FIGS. 10-12. Referring first to FIG. 10, the conduction assembly shown in FIG. 10 is adapted for a single-phase inductive load, and may also serve as a single-phase branch of a three-phase inductive load, in the same control manner. The conduction assembly comprises two MOSFET S1 and S2 which are in anti-series connection, wherein S1 is in anti-parallel connection with a body diode D1 and S2 is in anti-parallel connection with a body diode D2.

As shown in FIG. 10, in a first cycle, the conduction assembly is turned on at a first conduction angle. At the beginning of the conduction angle, the controller controls both S1 and S2 to turn on, and current flows through S1 and S2 to the inductive load.

As shown in FIG. 11, while the current decreases, when the controller detects that the current is less than the threshold, the controller controls S2 to turn off, whereupon the current flows through S1 and D2 to the load.

As shown in FIG. 12, when the controller detects that the current is zero, the controller controls S1 to turn off. At this time, since S2 has been turned off and meanwhile D2 blocks the reverse current, no reverse current flows through S1, so that zero current turn-off of the conduction assembly is naturally achieved.

When the currents are reversed, the operation is similar and will not be described in detail any more here.

It can be seen from the above operation process that in the process of soft start, the current will flow through the body diode of the MOSFET only at part of the time with a smaller current, and the current flows through the body of the MOSFET at the remaining time. Therefore, the loss of the conduction assembly during the entire soft start is greatly reduced.

In another aspect of the present disclosure, the present disclosure further discloses an apparatus for operating a conduction assembly, the conduction assembly being coupled between an AC power supply and an inductive load and comprises a first switch device and a second switch device which are in anti-series connection, the first switch device comprising a first body diode in anti-parallel connection with the first switch device, the second switch device comprising a second body diode in anti-parallel connection with the second switch device, the apparatus comprising: a current sampling device for sampling the current in the conduction assembly; and a controller communicatively connected to the current sampling device and configured to perform the method according to any of the preceding embodiments.

In another aspect of the present disclosure, the present disclosure further discloses a start device comprising the apparatus according to the previous embodiments.

In another aspect of the present disclosure, the present disclosure further discloses a computer-readable medium having stored thereon computer-executable instructions that, when executed on a processor, perform the method according to the preceding embodiments.

FIG. 13 illustrates a schematic block diagram of an example device 1300 that may be used to implement embodiments of the present disclosure. The device 1300 may be used to implement the methods 100 and 200 of FIGS. 7-8. The device 1300 may be implemented as the apparatus for operating the conduction assembly described above.

As shown, the device 1300 comprises a central processing unit (CPU controller) 1301 that may perform various appropriate actions and processing based on computer program instructions stored in a read-only memory (ROM) 1302 or computer program instructions loaded from a storage unit 1308 to a random access memory (RAM) 1303. The controller 1301 for example may be the apparatus for operating the conduction assembly described above. In the RAM 1303, there further store various programs and data needed for operations of the device 1300. The CPU 1301, ROM 1302 and RAM 1303 are connected to each other via a bus 1304. An input/output (I/O) interface 1305 is also connected to the bus 1304.

Various components in the device 1300 are connected to the I/O interface 1305, including: an input unit 1306 such as a keyboard, a mouse and the like; an output unit 1307 including various kinds of displays and a loudspeaker, etc.; a storage unit 1308 including a magnetic disk, an optical disk, etc.; a communication unit 1309 including a network card, a modem, and a wireless communication transceiver, etc. The communication unit 1309 allows the device 1300 to exchange information/data with other devices through a computer network such as the Internet and/or various kinds of telecommunications networks.

Various processes and processing described above, e.g., the methods 100 and 200 may be executed by the processing unit 1301. For example, in some embodiments, the methods 100 and 200 may be implemented as a computer software program that is tangibly included in a machine readable medium, e.g., a transitory computer readable medium (e.g., the storage unit 1308). In some embodiments, part or all of the computer program may be loaded and/or mounted onto the device 1300 via ROM 1302 and/or communication unit 1309. When the computer program is loaded to the RAM 1303 and executed by the CPU 1301, one or more steps of the methods 100 and 200 as described above may be executed. Alternatively, in other embodiments, CPU 1301 may be configured in any other proper manner (e.g., by a firmware) to execute the method 100 and 200.

Those skilled in the art should appreciate that the steps of the methods of the present disclosure described above may be implemented by a general-purpose computing device, may be centralized on a single computing device, or may be distributed over a network formed by multiple computing devices. Alternatively, they may be implemented in program code executable by the computing device, such that they may be stored in a storage device for execution by the computing device, or they may be respectively fabricated as integrated circuit modules, or multiple modules or steps therein may be fabricated as a single integrated circuit module for implementation. As such, the present disclosure is not limited to any specific combination of hardware and software. For example, some embodiments of the present disclosure further include program modules and/or integrated circuit modules for performing one or more steps of methods 100 and 200 and/or one or more other steps described in other embodiments of the present disclosure. These program modules may be included or embodied in a device, such as device 1300 of FIG. 13.

It should be appreciated that while several means or sub-means of the device have been mentioned in the detailed description above, such division is merely exemplary and not mandatory. In fact, the features and functions of two or more devices described above may be embodied in one device according to embodiments of the present disclosure. Conversely, the features and functions of one device described above may be further divided and embodied by a plurality of devices.

What are described above are optional embodiment of the present disclosure and not intended to limit the present disclosure. Those skilled in the art appreciate that the present disclosure may have various modifications and variations. Any modifications, equivalent substitutions, improvements, etc. made within the spirit and scope of the disclosure are intended to be included in the protection scope of the present disclosure.

We claim:

1. A method of operating a conduction assembly, the conduction assembly being coupled between an AC power supply and an inductive load and comprising a first switch device and a second switch device which are connected in anti-series connection, the first switch device comprising a first body diode in anti-parallel connection with the first switch device, and the second switch device comprising a second body diode in anti-parallel connection with the second switch device, the method comprising:

conducting the first switch device and the second switch device at a first conduction angle in a first cycle; and conducting the first switch device and the second switch device in a second cycle at a second conduction angle that is greater than the first conduction angle, wherein in the first cycle and second cycle, a turn-off timing of the first switch device or the second switch device in anti-parallel connection with the first body diode or second body diode having a conduction direction the same as a current direction is determined based on the current flowing through the conduction assembly.

2. The method according to claim 1, wherein determining the turn-off timing based on the current comprises:

detecting a magnitude of the current; and in response to the current being less than a threshold, providing a turn-off signal to the first switch device or the second switch device in anti-parallel connection with the first body diode or the second body diode having a conduction direction the same as a current direction.

3. The method according to claim 1, wherein the method further comprises conducting the conduction assembly in at least one third cycle at at least one third conduction angle, wherein the conduction angle used in a subsequent cycle in the first, second and third cycles is greater than that used in a previous cycle.

4. The method according to claim 1, wherein the method further comprises providing a turn-off signal to the first switch device or the second switch device in response to the current being equal to zero.

5. The method according to claim 1, wherein the method further comprises determining an increase in the conduction angle per cycle based on a voltage boost slope of the inductive load and a preset boost curve.

6. The method according to claim 2, wherein the threshold is determined based on an accuracy of the detection of the current.

7. The method according to claim 1, wherein the turn-off timing comprises a voltage zero crossing point of the conduction assembly.

8. An apparatus of operating a conduction assembly, the conduction assembly being coupled between an AC power supply and an inductive load and comprising a first switch device and a second switch device which are in anti-series connection, the first switch device comprising a first body diode in anti-parallel connection with the first switch device, and the second switch device comprising a second body diode in anti-parallel connection with the second switch device, the apparatus comprising:

a current sampling device for sampling the current in the conduction assembly; and a controller communicatively connected to the current sampling device and configured to perform a method, comprising:

conducting the first switch device and the second switch device at a first conduction angle in a first cycle; and conducting the first switch device and the second switch device in a second cycle at a second conduction angle that is greater than the first conduction angle, wherein in the first cycle and second cycle, a turn-off timing of the first switch device or the second switch device in anti-parallel connection with the first body diode or second body diode having a conduction direction the same as a current direction is determined based on the current flowing through the conduction assembly.

9. A start device, comprising:

a conduction assembly, being coupled between an AC power supply and an inductive load and comprising a first switch device and a second switch device which are in anti-series connection, the first switch device comprising a first body diode in anti-parallel connection with the first switch device, and the second switch device comprising a second body diode in anti-parallel connection with the second switch device, the start device configured to perform a method comprising:

conducting the first switch device and the second switch device at a first conduction angle in a first cycle; and conducting the first switch device and the second switch device in a second cycle at a second conduction angle that is greater than the first conduction angle, wherein in the first cycle and second cycle, a turn-off timing of the first switch device or the second switch device in anti-parallel connection with the first body diode or second body diode having a conduction direction the same as a current direction is determined based on the current flowing through the conduction assembly.

10. A non-transitory computer-readable medium having stored thereon computer-executable instructions that, when executed on a processor, perform the method according to claim 1.

\* \* \* \* \*